United States Patent
Kawano

(10) Patent No.: US 6,346,457 B1
(45) Date of Patent: Feb. 12, 2002

(54) PROCESS FOR MANUFACTURING SEMICONDUCTOR DEVICE

(75) Inventor: Hiroyuki Kawano, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/588,760

(22) Filed: Jun. 6, 2000

(30) Foreign Application Priority Data

Sep. 28, 1999 (JP) ............................................ 11-273911

(51) Int. Cl.$^7$ ................................................ H01L 21/76
(52) U.S. Cl. ...................... 438/424; 438/427; 438/438; 438/617; 438/719; 438/724
(58) Field of Search ................................. 438/424, 427, 438/428, 438, 692, 697, 698, 719, 738, 756, 723, 724

(56) References Cited

U.S. PATENT DOCUMENTS 6,048,775 A * 4/2000 Yao et al. .................... 438/427
6,140,242 A * 10/2000 Oh et al. ..................... 438/698

FOREIGN PATENT DOCUMENTS

JP          10-144781           5/1998

\* cited by examiner

Primary Examiner—Matthew Smith
Assistant Examiner—Igwe U. Anya
(74) Attorney, Agent, or Firm—Nixon & Vanderhye P.C.

(57) ABSTRACT

A process for manufacturing a semiconductor device comprising the steps of: depositing a polish-stopper film on a semiconductor substrate, applying a photoresist on the polish-stopper film and removing the photoresist from a region for forming a device isolation region to form an opening; dry etching using the photoresist as an etching mask to form a trench of a predetermined depth in the semiconductor substrate; removing the photoresist; forming a first insulating film and a second insulating film in sequence to bury the trench, the second insulating film being capable of being etched by the same etching step as that for the first insulating film and having an etching rate greater than that of the first insulating film; polishing the first and second insulating films by CMP method until a surface of the polish-stopper film is exposed; removing the polish-stopper film; and removing the first and second insulating films projected from a surface of the semiconductor substrate by etching using the same etchant, thereby to form a device isolation region in the trench.

12 Claims, 3 Drawing Sheets

PROCESS FOR MANUFACTURING SEMICONDUCTOR DEVICE

CROSS-REFERENCE TO RELATED APPLICATION

This application is related to Japanese application No. HEI 11(1999)-273911 filed on Sep. 28, 1999, whose priority is claimed under 35 USC § 119, the disclosure of which is incorporated by reference in its entirety.

BACKGROUND OF THE INVENTION

1. Field of the Invention

The present invention relates to a process for manufacturing a semiconductor device. More particularly, it relates to a process for device isolation utilizing shallow trench isolation (hereinafter referred to as STI) method.

2. Description of Related Art

Conventionally, LOCOS (Local Oxidization of Silicon) method has been widely used as a method for forming a device isolation region in a semiconductor device. As a demand for miniaturization of devices rises, LOCOS method by thermal oxidation has suffered from the generation of bird's beaks.

Then, STI method has been proposed to solve such a drawback of LOCOS method. STI method comprises the following steps. First, a groove, ex. a trench, is formed in a silicon substrate and an insulating film is formed to fill the trench. Then the insulating film formed on a region other than the trench is removed by chemical mechanical polishing (CMP) method. Through these steps, a device isolation region is formed. As compared with LOCOS method, STI method forms the insulating film by plasma CVD method or the like, which reduces thermal processes. Therefore, the bird's beaks occurred in LOCOS method can be greatly prevented.

However, STI method also has particular drawbacks. LOCOS method utilizes thermal oxidation as described above, so that after the device isolation region is formed, the surface has a relatively gentle undulation. In STI method, an edge portion of the device isolation region obtained after CMP method of the insulating film projects from the surface of the substrate and the projected portion forms sidewalls almost perpendicular to the substrate. Accordingly, at the formation of gate electrodes in a later step, a resist pattern formed by photolithography may excessively be narrowed or polysilicon (a gate electrode material) 25 may remain as shown in FIG. 4 after the gate electrodes is formed by etching. FIG. 4 is a view for illustrating drawbacks of the prior art, in which reference numeral 21 denotes a silicon substrate, 22 a STI region, 23 a gate insulating film and 24 a gate electrode.

In connection to the above drawbacks, for example, Japanese Unexamined Patent Publication No. HEI 10(1998)-144781 discloses a method for preventing the formation of level differences in the STI regions by using a SiN film as a CMP stopper in the formation of the STI regions. Further, a method for removing the projected portion in the STI regions by etching back has also been proposed.

Hereinafter, the above process using the CMP stopper will be explained with reference to FIGS. 5(a) to 5(g). FIGS. 5(a) to 5(g) illustrate a conventional process for forming the STI region.

First, on a silicon substrate 11, a first silicon nitride film 12, a first silicon oxide film 13, a second silicon nitride film 14 and a second silicon oxide film 15 are formed in sequence by CVD method (see FIG. 5(a)). Then, a resist pattern (not shown) having an opening in a region for forming a trench is formed by lithography. Using the resist pattern as a mask, anisotropic etching is performed by RIE method to form a trench 11A extending from the surface of the second silicon oxide film 15 into the silicon substrate 11 (see FIG. 5(b)).

The resist pattern is removed, and then a buried insulating film (a third silicon oxide film 16) and a third silicon nitride film 17 are formed by CVD method as shown in FIG. 5(c). The third silicon nitride film 17 inhibits the formation of a concave in the third silicon oxide film 16 during polishing by CMP method in a later step.

As shown in FIG. 5(d), the polishing by CMP method is performed on the third silicon nitride film 17 and continued until the surface of the second silicon nitride film 14 is exposed. Then, as shown in FIG. 5(e), the remaining third silicon nitride film 17 and the second silicon nitride film 14 are removed by wet etching. Then, as shown in FIG. 5(f), the first silicon oxide film 13 is removed and a convex portion 16A of the third silicon oxide film 16 is reduced in height by RIE method. Thereafter, as shown in FIG. 5(g), the first silicon nitride film 12 is removed by wet etching to expose the surface of the silicon substrate 11. Thus, the STI region is formed.

This process, however, forms a large number of stopper films (14, 13 and 12) for CMP and etching back processes and requires removal processes for the respective films. Therefore, the number of production steps is multiplied, which increases the production costs.

SUMMARY OF THE INVENTION

According to the present invention, provided is a process for manufacturing a semiconductor device comprising the steps of:

depositing a polish-stopper film on a semiconductor substrate, applying a photoresist on the polish-stopper film and removing the photoresist from a region for forming a device isolation region to form an opening;

dry etching using the photoresist as an etching mask to form a trench of a predetermined depth in the semiconductor substrate;

removing the photoresist;

forming a first insulating film and a second insulating film in sequence to bury the trench, the second insulating film being capable of being etched by the same etching step as that for the first insulating film and having an etching rate greater than that of the first insulating film;

polishing the first and second insulating films by CMP method until a surface of the polish-stopper film is exposed;

removing the polish-stopper film; and removing the first and second insulating films projected from a surface of the semiconductor substrate by etching using the same etchant, thereby to form a device isolation region in the trench.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
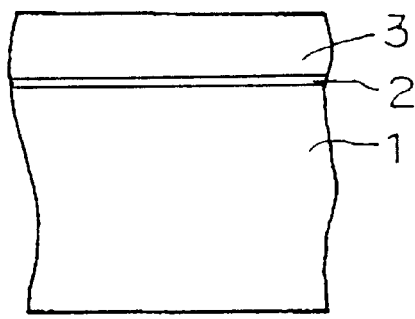
FIGS. 1(a) to 1(g) are views for illustrating an example of a process for manufacturing a semiconductor device according to the present invention.
Figure 1B:
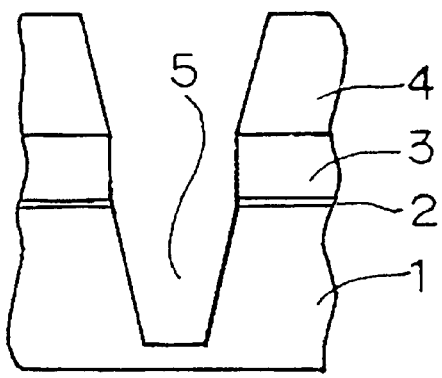

Hereinafter, the present invention will be detailed.

First, a polish-stopper film is formed on a semiconductor substrate. The semiconductor substrate used in the present invention is not particularly limited and any known substrates such as a silicon substrate can be used. The polish-stopper film is not particularly limited and any polish-resistant films such as a silicon nitride film can be used. The thickness of the polish-stopper film is preferably 0.1 to 0.2 μm. The polish-stopper film may be a laminate of a silicon oxide film and a silicon nitride film formed in this order on the semiconductor substrate for enhancing its function. In this case, the thickness of the silicon nitride film is preferably 0.1 to 0.2 μm. The silicon nitride film and the silicon oxide film can be formed by known techniques, for example, CVD method and thermal oxidization method, respectively.

Next, a photoresist is applied on the polish-stopper film and an opening is formed by removing the photoresist from a region for forming a device isolation region. Any known materials can be used as the photoresist. The opening can be formed by a known photolithography technique.

Using the photoresist having the opening as an etching mask, a trench of a predetermined depth is formed in the semiconductor substrate by dry etching. The depth of the trench may suitably be determined according to the intended device isolation. The trench is preferably tapered towards the bottom thereof so that an insulating film will be well buried in a later step. The plan configuration of the trench is not particularly limited.

A silicon oxide film of 10 to 100 nm thick is preferably formed on the inner surface of the trench to prevent defects caused by stress occurring in the semiconductor substrate in a later step of burying an insulating film in the trench. The silicon oxide film can be formed by thermal oxidization.

Then, after removing the photoresist, a first insulating film and a second insulating film are formed in sequence to bury the trench. The second insulating film is capable of being etched in the same etching process as that for the first insulating film and has an etching rate greater than that of the first insulating film. Preferably, the etching rate of the second insulating film is 3 to 10 times greater than that of the first insulating film. For example, an undoped silicate glass (USG) film and a low temperature oxide (LTO) film may be used in combination as the first and second insulating films of the present invention, respectively. The first insulating film preferably has a thickness with which at least the trench is buried, i.e., a thickness not less than the depth of the trench. More specifically, the preferred thickness is 200 to 500 nm, though it varies depending on the material constituting the film. The thickness of the second insulating film is preferably 100 to 400 nm, though it varies depending on the material constituting the film. Further, it is preferred that the first insulating film exists on the sides of the polish-stopper film constituting the trench.

The USG film can be formed using a high density plasma (HDP) CVD apparatus. The LTO film can be formed by plasma CVD method under an atmosphere of 200 to 500° C.

Further, the first and second insulating films may be annealed, respectively. The annealing of the first insulating film is intended for the densification of the film and preferably performed at 800 to 1100° C. for 0.5 to 2 hours. The annealing of the second insulating film is intended to control the etching rate thereof and preferably performed at 500 to 1000° C. for 0.5 to 2 hours.

Then, the first and second insulating films are polished by CMP method until the surface of the polish-stopper film is exposed.

Thereafter, the polish-stopper film is removed. Where the polish-stopper film is a silicon nitride film, it can be removed by phosphoric acid. Where the film is a silicon oxide film, it can be removed by hydrofluoric acid. According to this process, a convex portion is formed of the first and second insulating films projected from the top surface of the semiconductor substrate.

Then, the projected first and second insulating films are removed by etching using the same etchant, thereby to form a device isolation region in the trench. The first and second insulating films can be removed simultaneously so that the number of production steps is reduced. An example of the etchant used herein is hydrofluoric acid if the USG film and the LTO film are used as the first and second insulating films, respectively. The etching may also serve as a step of washing the elements that have been formed on the semiconductor substrate at least before the etching.

Hereinafter, the present invention will be explained in detail with reference to an example thereof.

Figure 1C:
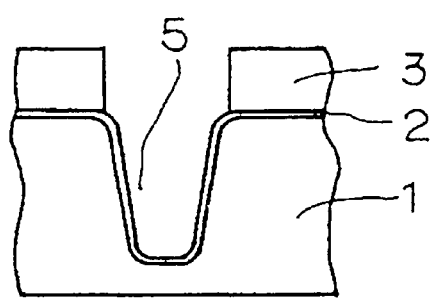
Figure 1D:
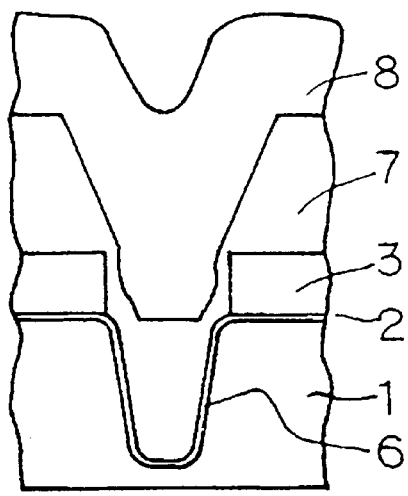
Figure 1E:
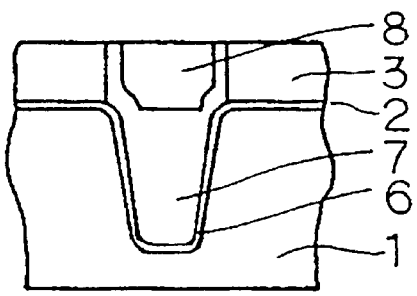
Figure 1F:
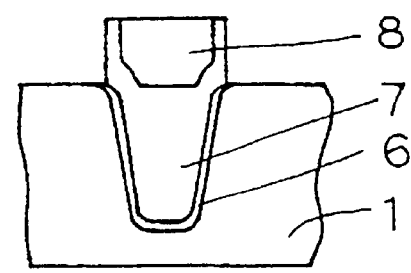
Figure 1G:
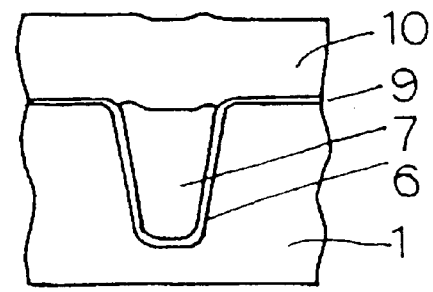
Figure 2:
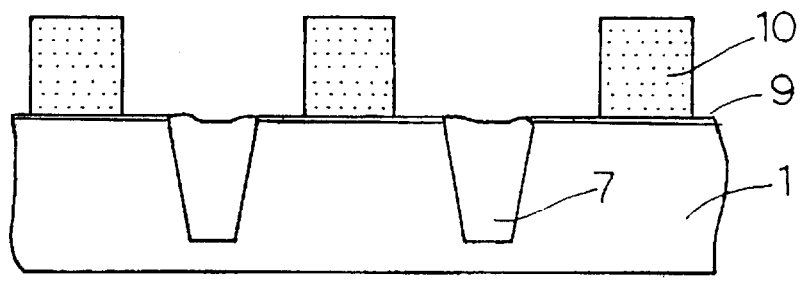
FIG. 2 is a sectional view illustrating a shallow trench device isolation region according to the present invention after forming a gate electrode.
Figure 3:
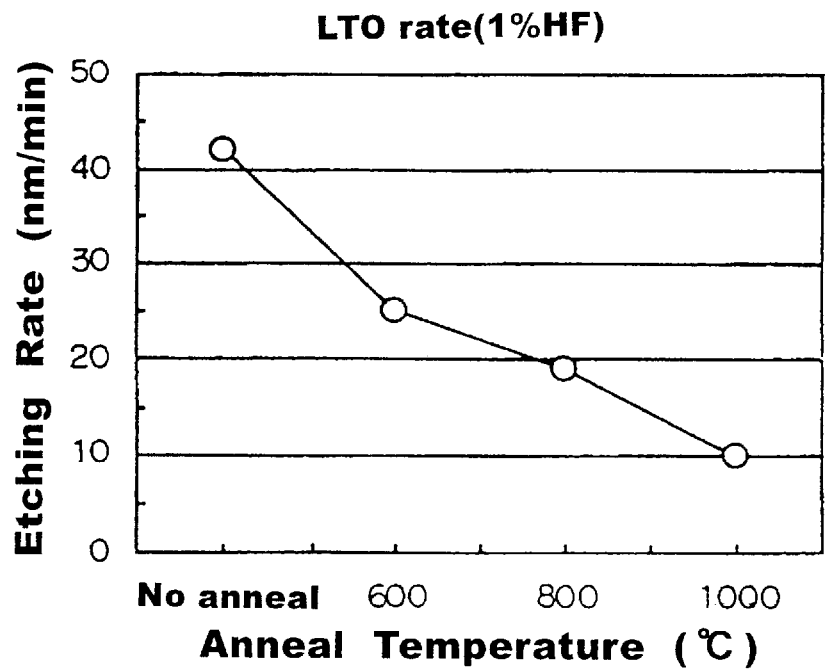
FIG. 3 is a graph illustrating a relationship between an annealing temperature and an etching rate of an LTO film.
Figure 4:
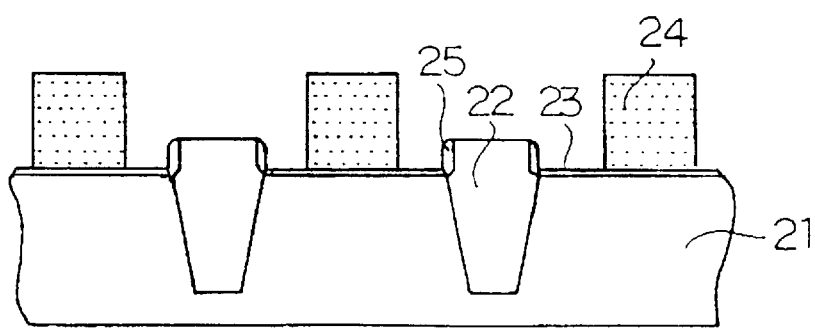
FIG. 4 is a view for illustrating drawbacks of a conventional process for forming a shallow trench device isolation region.
Figure 5A:
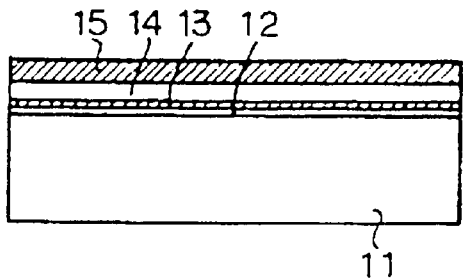
FIGS. 5(a) to 5(g) are views for illustrating a conventional process for forming a shallow trench device isolation region.
Figure 5D:
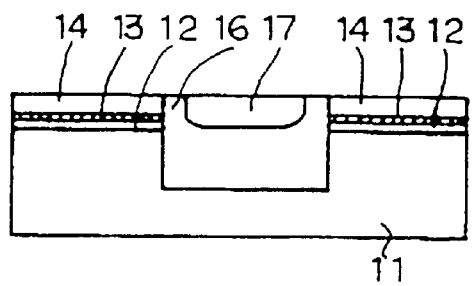
Figure 5B:
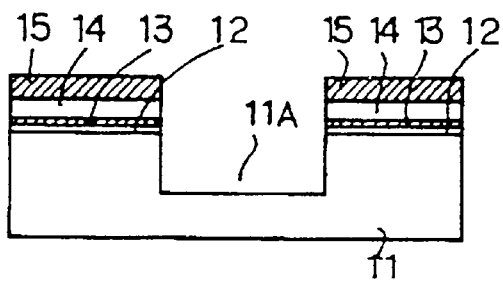
Figure 5E:
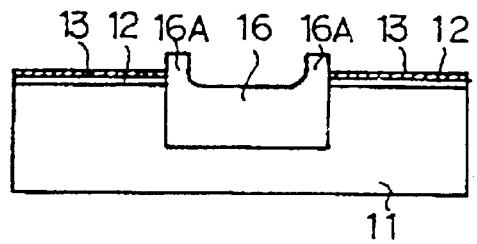
Figure 5C:
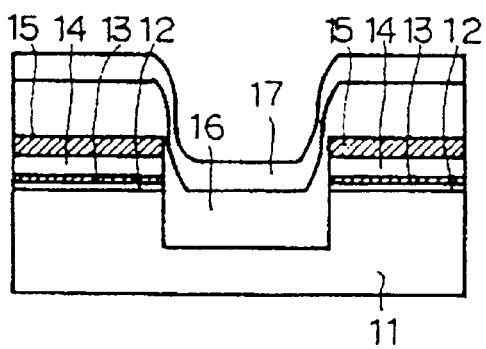
Figure 5F:
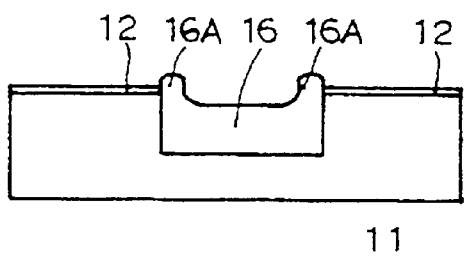
Figure 5G:
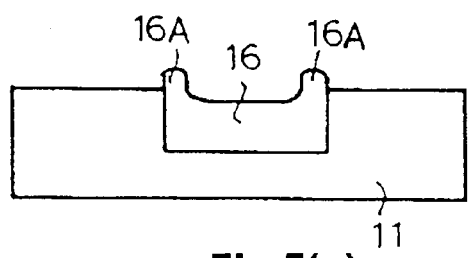

FIGS. 1(a) to 1(g) are views for illustrating an example of a process for manufacturing a semiconductor device according to the present invention, FIG. 2 is a sectional view illustrating an STI region according to the present invention after a gate electrode is formed, and FIG. 3 is a graph illustrating a relationship between an annealing temperature and an etching rate of an LTO film. In the figures, reference numeral 1 denotes a silicon substrate, 2 a pad oxide film, 3 a silicon nitride film, 4 a resist pattern, 5 a trench, 6 a silicon oxide film, 7 a USG film, 8 an LTO film, 9 a gate oxide film and 10 a gate electrode.

Hereinafter, an example of the process for manufacturing the semiconductor device according to the present invention will be explained with reference to FIGS. 1(a) to 1(g) and 2.

First, as shown in FIG. 1(a), on the silicon substrate 1, the pad oxide film 2 of 14 nm thick was formed by thermal oxidization method and the silicon nitride film 3 (a polish-stopper film) of 160 nm thick was formed by CVD method.

Then, the resist pattern 4 having an opening in a region for forming a device isolation region was formed by photolithography method. Using the resist pattern 4 as a mask, the pad oxide film 2 and the silicon nitride film 3 were etched by dry etching and simultaneously, the trench 5 of a predetermined depth was formed in the silicon substrate (see FIG. 1(b)). The depth of the trench was 350 nm. The trench was tapered to a certain extent so that an insulating film will be well buried therein in a later step.

The resist pattern 4 was removed, and then the silicon oxide film 6 of about 30 nm thick was formed by thermal oxidization method as shown in FIG. 1(c) to prevent defects caused by stress occurred in the silicon substrate 1 when a buried insulating film is formed in the trench 5. Then, as shown in FIG. 1(d), the USG film (a first insulating film) 7 free from impurities was buried in the trench 5. Where the device isolation region is made of an insulating film containing impurities, transistor characteristics are deteriorated. Therefore an insulating film without containing impurities was used in this example. The USG film 7 was formed by CVD method utilizing an HDP-CVD apparatus, for example. The thickness of the USG film 7 was determined to correspond with the depth of the trench. In this example, the thickness was 350 nm. The USG film 7 was annealed at around 1000° C. for densification after the formation thereof.

Next, the LTO film 8 (a second insulating film) was formed. In this example, the LTO film 8 of 250 nm thick was formed by plasma CVD method. In consideration of reduction of the insulating film through washing in later steps, the LTO film 8 was annealed at 750° C. for 1 hour after the formation thereof to control its wet etching rate.

Wet etching (washing step) supposed to etch 200 to 500 Å in terms of the USG film was performed before the formation of the gate electrode. To remove a projection formed of the LTO film 8 and the USG film 7 on the top surface of the silicon substrate 1 at this time, the etching rates of both films need to be controlled. In this example, the etching rate of the buried LTO film 8 was determined to be 3 to 10 times greater than that of the buried USG film 7. An appropriate difference between the etching rates varies depending on the remaining buried films after a CMP step to be described later. Therefore the difference between the etching rates of the laminated buried films does not limit the present invention.

Next, as shown in FIG. 1(e), the LTO film 8 and the USG film 7 on a region other than the inside of the trench were removed by CMP method using the silicon nitride film 3 as a stopper. At this time, the USG film 7 of 350 nm thick and the LTO film 8 of 20 to 150 nm thick were left in the trench. Where the USG film alone is buried in the trench according to the prior art, the film of 370 to 500 nm thick remains, which makes the reduction of level difference in the STI regions difficult.

Then, as shown in FIG. 1(f), the silicon nitride film 3 and the pad oxide film 2 were sequentially removed by wet etching. Phosphoric acid heated at about 150° C. and hydrofluoric acid at a room temperature were used to remove the silicon nitride film 3 and the pad oxide film 2, respectively. Then, the USG film 7 and the LTO film 8 were removed by one wet etching using the same etchant, i.e., hydrofluoric acid, to expose the surface of the silicon substrate 1. Thus, the STI region was formed.

Then, as shown in FIG. 1(a), a gate oxide film 9 and a gate electrode 10 were formed after ion implantation to the silicon substrate 1, washing and the like. In this example, the gate oxide film 9 was formed in a thickness of 32 nm by thermal oxidization method and the gate electrode 10 was formed of polysilicon in a thickness of 200 nm by LP-CVD method.

The thickness of the films buried in the trench of the STI region was reduced from the thickness after the STI-CMP step to the thickness after the formation of the gate electrode because of the washing step with HF and the like. In this example, the USG film 7 and the LTO film 8 were laminated on the STI region. Therefore, the LTO film 8 having a greater etching rate with respect to hydrofluoric acid was reduced faster. The etching rate of the STI region was lowered after the LTO film 8 was completely removed, i.e., when the surface of the USG film 7 was exposed. Accordingly, the above-mentioned variation in the thickness of the films remaining in the trenches after the STI-CMP step is alleviated, which further reduces the level difference in the STI regions. Thus, as shown in FIG. 2, the remains after the etching for forming the gate electrode caused by the level difference in the STI regions, which has been problematic in the prior art, can be dissolved.

A desired etching rate can be obtained by controlling the annealing temperature for the LTO film 8, for example, in view of the relationship between the annealing temperature and the etching rate of the LTO film 8 shown in FIG. 3.

As detailed above, the process for manufacturing the semiconductor device of the present invention can get rid of difficulties in processing the gate electrode due to the level difference in the STI regions, which has been problematic in the prior art, without any drastic changes in the conventional process for forming the STI region. In particular, the number of the production steps is hardly increased. Accordingly, the yield of semiconductor devices is improved, that is, the production costs can be reduced. Further, the present invention can satisfy a demand for further miniaturization of the device isolation region and high integration of the semiconductor device.

Further, since the USG film and the LTO film are used as the first and second insulating films, respectively, and hydrofluoric acid is used as the common etchant, the first and second insulating films can be removed while maintaining an appropriate difference between the etching rates thereof. Thus, the level difference in the STI regions can be reduced.

Still further, since the etching rate of the LTO film is determined by controlling the annealing temperature for the LTO film, the level difference between the STI regions and the substrate surface can be more reduced.

Furthermore, the process for manufacturing the semiconductor device can be simplified by performing etching and washing of the elements formed on the semiconductor substrate by one operation.

In addition, since the silicon nitride film is used as the polish-stopper film and the silicon oxide film is formed between the silicon nitride film and the semiconductor substrate, the polishing can surely be stopped.

What is claimed is:

1. A process for manufacturing a semiconductor device comprising:

depositing a polish-stopper film on a semiconductor substrate, applying a photoresist on the polish-stopper film and removing the photoresist from a region for forming a device isolation region to form an opening;

dry etching using the photoresist as an etching mask to form a trench of a predetermined depth in the semiconductor substrate;

removing the photoresist;

forming a first insulating film and a second insulating film each at least partially below a surface of the polish-stopper film, in sequence to bury the trench, the second insulating film being capable of being etched by the same etching step as that for the first insulating film and having an etching rate greater than that of the first insulating film;

polishing the first and second insulating films by CMP method until a surface of the polish-stopper film is exposed;

removing the polish-stopper film; and removing the first and second insulating films projecting from a surface of the semiconductor substrate by etching using the same etchant so that the second insulating film is entirely removed and at least part of the first insulating film remains in the trench, thereby to form a device isolation region in the trench.

2. A process according to claim 1, wherein the first insulating film is an undoped silicate glass film, the second insulating film is an low temperature oxide film and the etchant is hydrofluoric acid.

3. A process according to claim 2, further comprising the step of annealing the second insulating film before the etching for removing the first and second insulating films, wherein the etching rate of the second insulating film is determined to an appropriate value by controlling a temperature for the annealing.

4. A process according to claim 2, wherein the etching rate of the second insulating film is 3 to 10 times greater than that of the first insulating film.

5. A process according to claim 1, wherein the etching of the first and second insulating films serve as a washing step for elements that have been formed on the semiconductor substrate before the etching.

6. A process according to claim 1, wherein the polish-stopper film comprises a laminate of a silicon oxide film and a silicon nitride film formed in this order on the semiconductor substrate.

7. A process according to claim 1, further comprising the step of forming a silicon oxide film on an inner surface of the trench after the formation of the trench before the formation of the first insulating film.

8. A process according to claim 1, wherein the first insulating film is formed on the sides of the trench formed in the polish-stopper film.

9. A process according to claim 1, wherein the device isolation region comprises the first insulating film.

10. A process according to claim 1, wherein the first insulating film has a thickness substantially the same as the depth of the trench.

11. The process of claim 1, wherein said removing of the first and second insulating films projecting from a surface of the semiconductor substrates takes place after the polish-stopper film has been removed.

12. A process for manufacturing a semiconductor device comprising:

depositing a polish-stopper film on a semiconductor substrate;

dry etching the semiconductor substrate and the polish-stopper film in order to form a trench in the semiconductor substrate;

forming a first insulating film and a second insulating film each at least partially below a surface of the polish-stopper film, in sequence, in order to bury the trench in the semiconductor substrate, the second insulating film being capable of being etched by the same etching step as that for the first insulating film and having an etching rate greater than that of the first insulating film;

polishing the first and second insulating films until a surface of the polish-stopper film is exposed;

removing the polish-stopper film; and after said removing of the polish-stopper film, removing the first and second insulating films projecting from a surface of the semiconductor substrate by etching so that the second insulating film is entirely removed and at least part of the first insulating film remains in the trench, thereby to form a device isolation region via the trench.

* * * * *